United States Patent [19]

Schroeder

[11] 4,242,644

[45] Dec. 30, 1980

[54] PULSE MODULATOR FOR OPERATING A DEVICE IN THE AVALANCHE MODE

[75] Inventor: John O. Schroeder, Hamilton Township, Mercer County, N.J.

[73] Assignee: RCA Corporation, New York, N.Y.

[21] Appl. No.: 44,390

[22] Filed: Jun. 1, 1979

[51] Int. Cl.³ .......................... H03F 3/10; H03F 3/60
[52] U.S. Cl. ................................... 330/297; 330/287; 331/115
[58] Field of Search ................. 330/297, 287; 331/115

[56] References Cited

U.S. PATENT DOCUMENTS 3,743,967  7/1973  Fitzsimmons et al. .............. 330/287

OTHER PUBLICATIONS

Morris et al., "A 1-Watt, 6-Gigahertz IMPATT Amplifier for Short-Haul Radio Applications," B.S.T.J. vol. 54, No. 4, Apr. 1975, pp. 721-733.

Primary Examiner—Alfred E. Smith
Assistant Examiner—T. N. Grigsby
Attorney, Agent, or Firm—Samuel Cohen; Robert L. Troike; Raymond E. Smiley

[57] ABSTRACT

An impatt diode in a radio frequency circuit is pulse modulated by a circuit comprising a constant current source providing threshold current and a pulsed current circuit providing drive current. The current applied to the impatt diode by the pulsed current source may be adjusted to increase or decrease as a function of time.

8 Claims, 1 Drawing Figure

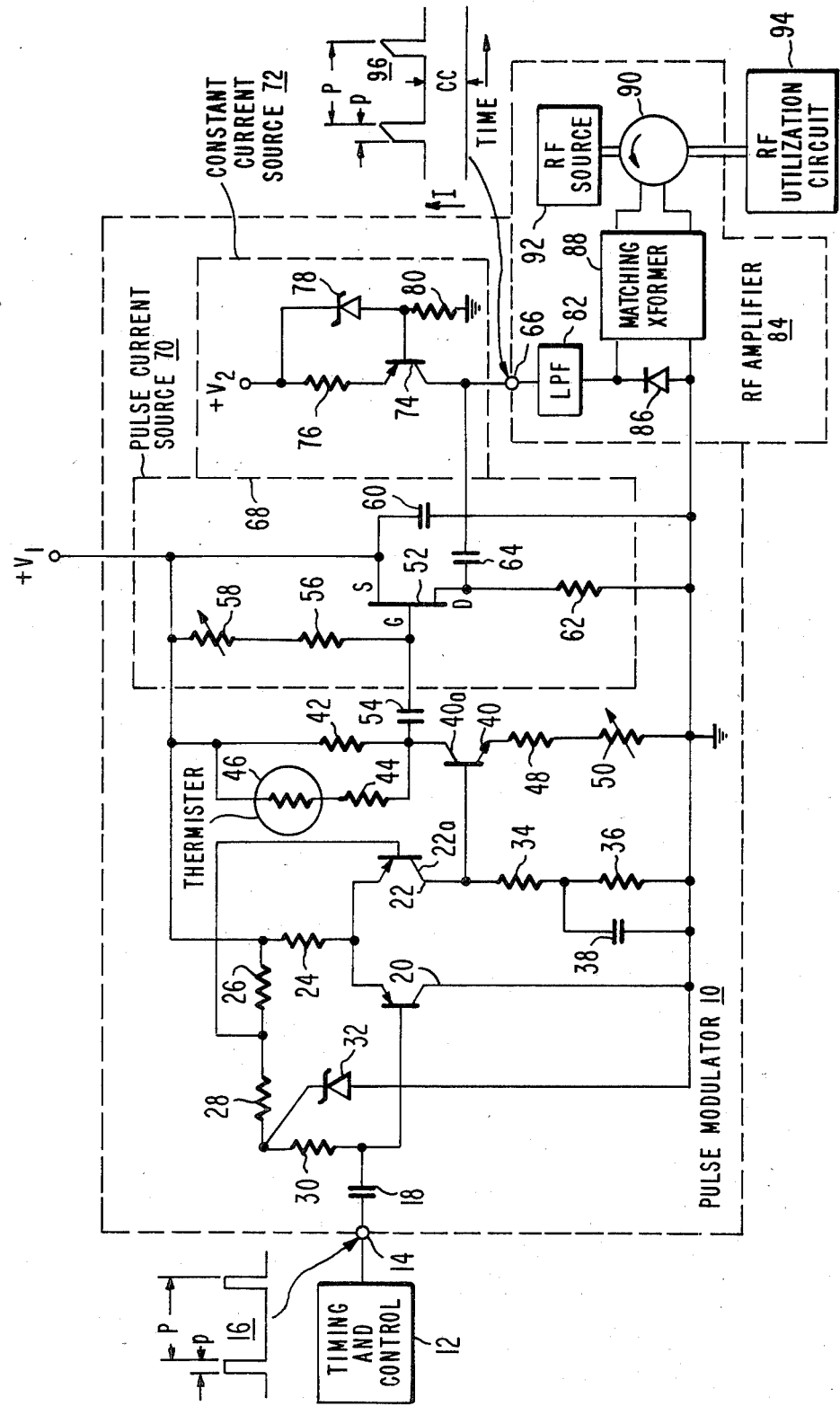

PULSE MODULATOR FOR OPERATING A DEVICE IN THE AVALANCHE MODE

Prior art pulse modulator circuits for driving impatt diodes to breakdown for amplification or oscillation purposes have utilized a constant voltage source adjusted to the avalanche breakdown threshold voltage of the diode combined with a pulsed current source to drive the diode into its avalanche mode of operation or negative resistance state. Such modulation circuits suffer in performance because the breakdown threshold voltage of impatt diodes is not fixed but rather is a function of ambient temperature and other factors such as parameter variation from diode to diode. Typical avalanche breakdown voltages for silicon diodes may vary from 80 to 120 volts. Thus, the typical constant voltage source would have to be set below 80 volts to avoid undesired breakdown. The rest of the voltage, 40 volts in this case, would then be supplied by the pulsed current source. Prior art pulsed current sources are really quasi constant current sources which do not have unlimited current or voltage capability and therefore cannot always drive all impatt diodes to the same level of pulse current under all conditions. Therefore, in the prior art elaborate and costly additional circuits had to be provided to compensate for the anticipated range of diode parameters. The alternative to this was carefully "tailoring" each pulse driver to function properly with a specific diode.

In accordance with the present invention a pluse modulator circuit for applying power to a device for causing it to operate in its avalanche mode of operation comprises a constant current source coupled to the device to provide a current causes the device to operate at its voltage breakdown threshold and further comprises a source of pulsed current also coupled to the device for providing additional drive current thereto. In one embodiment the current of the pulsed current source is adjusted as a function of time.

The sole FIGURE is a pulse modulation circuit for an impatt diode utilized as a radio frequency amplifier.

With reference to the sole FIGURE, a pulse modulator circuit 10 is receptive of a series of pulses from a timing and control circuit (T/C) 12. T/C 12 may be a crystal oscillator with appropriate divider circuits to provide timed signals as desired. In particular, T/C 12 produces at terminal 14 a signal illustrated in waveform 16, i.e., a signal having pulses of pulse width or pulse time duration, p, and having a period or spacing between pulses of, P. Thus, the pulse repetition rate of waveform 16 is 1÷P. Exemplary figures for p and P are 10 microseconds and 3.5 milliseconds respectively.

Terminal 14 is a.c. coupled via capacitor 18 to the base of transistor 20 which is one of a pair of current steered PNP transistors 20 and 22. The emitters of transistors 20 and 22 are connected together and resistively coupled via bias resistor 24 to a bias source of potential +V1. The base of the second transistor 22 is connected between the junction of resistors 26 and 28 which resistors comprise a voltage divider. The distal end of resistor 26 is connected to +V1 while the distal end of resistor 28 is connected to a resistor 30 and to a zener diode 32 referenced to circuit ground. The distal end of resistor 30 is connected to the junction of capacitor 18 and the base of transistor 20. The collector of transistor 20 is connected to circuit ground. The collector of transistor 22 is coupled to circuit ground via the series connection of resistors 34 and 36 the junction of which is connected to a capacitor 38 which is in turn connected to circuit ground.

The purpose of transistors 20 and 22 is to produce at the collector 22a of transistor 22 a constant voltage signal so long as any pulse is present at terminal 14, regardless of the amplitude of the pulse appearing at terminal 14. The collector of transistor 22 is connected to the base of transistor 40 for providing additional voltage amplification and polarity inversion. The collector of transistor 40 is connected to the parallel combination of a first resistor 42 and a second resistor 44 connected in series with a thermistor 46, the parallel connection being connected to voltage bias +V1. Thermistor 46 is subject to ambient temperature.

The emitter of transistor 40 is connected to resistor 48 series connected to potentiometer 50 which is in turn connected to circuit ground. There is thus provided at the collector 40a of transistor 40 a voltage pulse corresponding in pulse width to pulses from waveform 16 which is constant with constant ambient temperature and which decreases in value as the ambient temperature increases and visa versa.

The voltage pulse at the collector of transistor 40 is coupled to the gate of an output current drive transistor 52 via capacitor 54 which along with the series connection of resistor 56 and potentiometer 58 connected to bias source +V1 form a time constant (RC) circuit. Typically, a MOS power transmitter is used for transistor 52 but other types of transistors could be used. The source of MOS device 52 is directly connected to bias source +V1 and is connected via a bypass capacitor 60 to circuit ground. The drain of device 52 is connected to a resistor 62 which is connected to circuit ground and is connected to one end of a capacitor 64. The distal end of capacitor 64 is connected to an output terminal 66 of pulse modulator 10. Device 52 and other elements within dash block 68 are part of a pulsed current source 70. The purpose of pulsed current source 70 is to convert constant voltage pulses corresponding to successive pulses of waveform 16 into current pulses at terminal 66 the current amplitude of each of which is determined in part by the setting of resistor 50, the ambient temperature measured by thermistor 46 and the RC time constant determined by components 54, 56 and 58.

Additional current in the form of threshold current is supplied to terminal 66 by a constant current source 72. Constant current source 72 includes a PNP transistor 74 the emitter of which is coupled via resistor 76 to a second source of bias potential +V2. The base of transistor 74 is connected to a voltage level determining zener diode 78 connected between the base of transistor 74 and source +V2. A bias resistor 80 is connected between the base of transistor 74 and circuit ground. Terminal 66 is connected to a low pass filter 82 of a radio frequency amplifier circuit 84. Low pass filter 82 is connected to one end of a negative resistance amplification device such as an impatt diode 86, the other end of which is connected to circuit ground. A matching transformer 88 is connected across impatt diode 86 and the output terminals of matching transformer 88 are connected to a circulator 90. Circulator 90 is also receptive of RF signals from an RF signal source 92 and provides amplified RF signals, amplified by impatt diode 86, to an RF utilization circuit 94 which may comprise an additional RF amplifier circuit such as circuit 84.

By proper selection of resistor 76, constant current source 72 is adjusted to provide a current at terminal 66 which is at least equal to the product of the maximum pulse width, p, times the maximum pulse repetition rate, $1 \div P$, times the maximum peak drive current required for desired power output from impatt diode 86. As long as this constant current is supplied to impatt diode 86 the drive current through the impatt diode will not be affected by changes in diode parameters with temperature or from diode to diode.

In operation, timing and control circuit 12 provides at terminal 14 a series of spaced apart pulses having a given pulse width p and pulse separation P. Transistors 20, 22 and 40 and associated curcuits provide, for a given ambient temperature, constant voltage pulses at the collector 40a of transistor 40. The amplitude of the pulses is determined in part by the setting of potentiometer 50.

It has been found, through field tests, that the power output of impatt diodes such as diode 86 tends to increase with an increase in ambient temperature. For example, compared to a standard temperature of 25° C. operation, the power output increases by about 10% at 70° and is reduced by about 10% at −20° C. Thus, by the addition of the temperature sensitive circuit comprising resistors 44, 42 and thermistor 46, the current supplied to diode 86 decreases with increases in ambient temperature to maintain a constant power output of diode 86 with changes in ambient temperature.

Further, it is known that the power output of impatt diode amplifiers and the output frequency of impatt diode oscillators varies as a function of junction temperature of the diode due to current applied thereto. The junction temperature varies with time and typically increases with time. Therefore, to insure constant power output or stable frequency during the pulse "on" time the pulsed current supplied to diode 86 must change with time. This variance as a function of time is otherwise known as "tilt." The current tilt is provided for by generating a voltage waveform at the input to transistor 52 which changes as a function of time. This is accomplished by means of RC time constant circuit comprising capacitor 54 and resistor 56 and potentiometer 58 in conjunction with the parallel circuit of capacitor 38 and resistor 36. By means of adjustment potentiometer 58 the voltage as a function of time appearing at the input of device 52 and therefore the current as a function of time appearing at terminal 66 can be caused to vary upward or downward by proper adjustment of potentiometer 58. Regardless of the current drive pulses supplied to terminal 66 a smaller constant current is also applied to terminal 66 by constant current source 72. This constant current indicated by CC in waveform 96 is set to a value equal to or somewhat greater than the product of peak diode current required times the duty cycle of the input pulse train, 16. Thus, when current pulses do appear diode 86 becomes operational as a negative resistance device. In the RF amplifier circuit shown the signal provided by RF source 92 at circulator 90 is amplified in power by diode 86 and passed via circulator 90 to a radio frequency utilization circuit which as previously stated may be another circuit similar to amplifier 84. In one exemplary circuit the following component values are utilized.

| Component Names & Numbers | Component Values |
| --- | --- |
| Resistor 24 | 2.7 k ohms |
| Resistor 26 | 2.2 k ohms |
| Resistor 28 | 43 ohms |
| Resistor 30 | 4.7 k ohms |
| Resistor 34 | 560 ohms |
| Resistor 36 | 5.1 k ohms |

| Component Names & Numbers | Component Values |
| --- | --- |
| Resistor 42 | 250 ohms |
| Resistor 44 | 750 ohms |
| Thermistor 46 | 1 k ohms |
| Resistor 48 | 150 ohms |
| Potentiometer 50 | 500 ohms |
| Resistor 56 | 6.8 k ohms |
| Potentiometer 58 | 50 k ohms |
| Resistor 62 | 220 ohms |
| Resistor 80 | 15 k ohms |
| Resistor 76 = $\dfrac{5.4}{\dfrac{1}{p} \times p \times I_{pk}}$ | | where, $I_{pk}$ is the peak drive current required to provide desired output power.

| | |
| --- | --- |
| Capacitor 18 | 1.0 microfarads |
| Capacitor 38 | 0.1 microfarads |
| Capacitor 54 | 0.0047 microfarads |
| Capacitor 60 | 100 microfarads |
| Capacitor 64 | 5.0 microfarads |
| Zener Diode 32 | 1N5252B(24v.) |
| Zener Diode 78 | 1N5234B(6.2v.) |
| Transistors 20, 22 | 2N4126 |
| Transistor 40 | MRF531 |
| MOS Device 52 | 2SJ50 |
| Transistor 74 | MM4002* |
| +V1 | 50 volts |
| +V2 | 150 volts* |

*Assumes diode 86 is a silicon type diode.

I claim:

1. A pulse modulator for applying power to a device for causing it to operate in its avalanche mode of operation with a desired power output, said device having a voltage breakdown threshold, comprising in combination:

a constant current source coupled to said device for providing thereto a current which causes said device to operate just at its voltage breakdown threshold; and a source of pulse current also coupled to said device for producing periodic current pulses each of which, when added to said constant current, provides sufficient total current to provide the desired power output from said device.

2. The combination as set forth in claim 1 further including ambient temperature sensing means for causing the magnitude to said current pulses to vary as a function of ambient temperature.

3. The combination as set forth in claim 1 further including means for altering the magnitude of each current pulse as a function of time.

4. The combination as set forth in claim 1 wherein said source of pulse current comprises a transistor circuit.

5. The combination as set forth in claim 1 further including a source of constant voltage pulses and wherein said source of pulse current is responsive to said source of constant voltage pulses for producing said periodic current pulses.

6. The combination as set forth in claim 1 wherein said device is arranged in a radio frequency amplifying circuit.

7. The combination as set forth in claim 6 wherein said radio frequency amplifying circuit comprises a matching transformer coupled to said device, a circulator coupled at one port to said matching transformer, a radio frequency source coupled to a port of said circulator and a radio frequency utilization circuit coupled to another port of said circulator.

8. The combination of claim 1, 2, 3, 4, 5, 6 or 7 wherein said device is an impatt diode.

* * * * *